United States Patent
Chen et al.

(10) Patent No.: US 12,266,922 B2
(45) Date of Patent: Apr. 1, 2025

(54) REVERSE BATTERY PROTECTION CIRCUIT WITH ISOLATION AND REVERSE POLARITY CIRCUITS

(71) Applicants: STMicroelectronics (China) Investment Co., Ltd., Shanghai (CN); STMicroelectronics S.r.l., Agrate Brianza (IT)

(72) Inventors: Ping Chen, Shanghai (CN); Hui Yan, Shanghai (CN); Vincenzo Randazzo, Biancavilla (IT); Alberto Marzo, Giarre (IT); Andrea Camillo Re, Valverde (IT)

(73) Assignees: STMicroelectronics S.r.l., Agrate Brianza (IT); STMicroelectronics (China) Investment Co., Ltd., Shanghai (CN)

( * ) Notice: Subject to any disclaimer, the term of this patent is extended or adjusted under 35 U.S.C. 154(b) by 375 days.

(21) Appl. No.: 17/844,306

(22) Filed: Jun. 20, 2022

(65) Prior Publication Data
US 2023/0411953 A1 Dec. 21, 2023

(51) Int. Cl.
  *H02H 7/18* (2006.01)
  *H02H 1/00* (2006.01)
(52) U.S. Cl.
  CPC ............ *H02H 7/18* (2013.01); *H02H 1/0007* (2013.01)
(58) Field of Classification Search
  CPC ........ H02H 7/18; H02H 1/0007; H02H 3/087; H02H 7/008; H02H 11/002;
  (Continued)

(56) References Cited

U.S. PATENT DOCUMENTS

| | | |
|---|---|---|
| 5,847,911 A | 12/1998 | Van Reenen et al. |
| 11,271,558 B2 | 3/2022 | Djelassi-Tscheck et al. |

(Continued)

FOREIGN PATENT DOCUMENTS

| | | | |
|---|---|---|---|
| CN | 207251245 U | 4/2018 | |
| DE | 102010020295 A1 * | 11/2011 | ............ H02J 7/0034 |

(Continued)

OTHER PUBLICATIONS

Mouser Electronics "VNF1048F, High-side switch Controller with intelligent fuse protection for 12 V, 24 V and 48 V automotive applications" May 2022. Retrieved from the Internet: <URL: https://www.mouser.com/pdfDocs/vnf1048f.pdf> (Year: 2022).*

(Continued)

*Primary Examiner* — Jared Fureman
*Assistant Examiner* — Nicolas Bellido
(74) *Attorney, Agent, or Firm* — Slater Matsil, LLP

(57) ABSTRACT

A circuit for reverse battery protection includes an isolation circuit and a control circuit. The isolation is circuit coupled between a gate output of an electronic fuse (E-fuse) and at least one external metal-oxide-semiconductor field-effect transistor (MOSFET). The E-fuse is coupled between a battery voltage pin and an external ground pin and further coupled to a microcontroller. The isolation circuit is configured to disconnect the gate output from the at least one external MOSFET when the battery is installed with reverse polarity. The control circuit is coupled between the external ground pin and the at least one external MOSFET. The control circuit is configured to turn on the at least one external MOSFET when the battery is installed with the reverse polarity.

20 Claims, 5 Drawing Sheets

(58) Field of Classification Search
CPC ........... H03K 17/6872; H03K 17/0822; H03K 17/102; H03K 17/122; H02J 7/0034
See application file for complete search history.

(56) References Cited

U.S. PATENT DOCUMENTS

| | | | |
|---|---|---|---|
| 2006/0126245 A1 | 6/2006 | Grose et al. | |
| 2020/0076190 A1* | 3/2020 | La Rosa | H02H 11/003 |
| 2020/0389009 A1* | 12/2020 | Troyer | H02H 9/025 |
| 2022/0017054 A1* | 1/2022 | Suelzle | B60T 17/02 |

FOREIGN PATENT DOCUMENTS

| | | | | |
|---|---|---|---|---|
| DE | 102017100304 A1 * | 7/2018 | | H02H 1/04 |
| EP | 2131497 A1 | 12/2009 | | |
| JP | 2007019812 A | 1/2007 | | |

OTHER PUBLICATIONS

Steven M. Kaplan, "C," in Wiley Electrical and Electronics Engineering Dictionary, IEEE, 2004, pp. 88-162 Retrieved from the Internet: <https://ieeexplore.ieee.org/xpl/ebooks/bookPdfWithBanner.jsp?fileName=5273129.pdf&bkn=5273107&pdfType=chapter> (Year: 2004).*

STMicroelectronics, "eFuses (electronic fuses), STMicroelectronics," Nov. 2, 2023, pp. 1-2, Retrieved from the Internet, https://www.st.com/en/power-management/e-fuses.html.

European Extended Search Report, EP Application No. 23176695.7, mailed Nov. 28, 2023, 12 pages.

* cited by examiner

REVERSE BATTERY PROTECTION CIRCUIT WITH ISOLATION AND REVERSE POLARITY CIRCUITS

TECHNICAL FIELD

The present invention relates generally to methods and apparatuses for circuit protection, and in particular embodiments, to methods and apparatuses for reverse battery protection.

BACKGROUND

E-fuse devices are integrated circuits designed to detect and react to abnormal conditions in an electrical system. Such abnormal conditions may include overcurrent and overvoltage. E-fuses are widely used in today's electrical engineering applications, especially in new energy vehicles. Unlike conventional electrical safety devices (such as fuses using a metal strip), E-fuses may offer efficiency by reducing power consumption. E-fuses may be more reliable because they usually have unlimited switching cycles and are less sensitive to vibration. In the events of reverse battery installation, unexpected voltages or currents may destroy an E-fuse or an electronic control unit (ECU) or even cause damage to a battery. Thus, advanced reverse battery protection is desired to keep these devices safe, especially in automotive applications.

SUMMARY

In accordance with an embodiment, a circuit for reverse battery protection includes an isolation circuit coupled between a gate output of an electronic fuse (E-fuse) and at least one external metal-oxide-semiconductor field-effect transistor (MOSFET). The E-fuse is coupled between a battery voltage pin and an external ground pin and is further coupled to a microcontroller. The isolation circuit is configured to disconnect the gate output from the at least one external MOSFET when a battery is installed with reverse polarity. The circuit further includes a control circuit coupled between the external ground pin and the at least one external MOSFET. The control circuit is configured to turn on the at least one external MOSFET when the battery is installed with the reverse polarity.

In accordance with an embodiment, the circuit further includes wherein the isolation circuit includes a first P-channel MOSFET coupled between a gate of the at least one external MOSFET and the gate output of the E-fuse and a bipolar junction transistor (BJT) coupled between a gate of the first P-channel MOSFET and the external ground pin, the microcontroller coupled to the BJT and configured to turn on the BJT when the battery is installed with correct polarity and to turn off the BJT when the battery is installed with the reverse polarity.

In accordance with an embodiment, the circuit further includes wherein the control circuit includes a diode coupled between the external ground pin and the gate of the at least one external MOSFET.

In accordance with an embodiment, the circuit further includes a N-channel MOSFET, a gate of the N-channel MOSFET coupled to the battery voltage pin, a drain of the N-channel MOSFET coupled to a ground pin of the E-fuse, a source of the N-channel MOSFET coupled to the external ground pin, the N-channel MOSFET configured to block a reverse current flowing from the external ground pin to the ground pin of the E-fuse when the battery is installed with the reverse polarity.

In accordance with an embodiment, the circuit further includes a second P-channel MOSFET, a gate of the second P-channel MOSFET coupled to the external ground pin, a source of the second P-channel MOSFET coupled to the microcontroller, a drain of the second P-channel MOSFET coupled to a Virtual Serial Peripheral Interface (VSPI) pin of the E-fuse, the second P-channel MOSFET configured to block a reverse current flowing from the microcontroller to the VSPI pin of the E-fuse when the battery is installed with the reverse polarity.

In accordance with an embodiment, the circuit further includes a plurality of Zener diodes, each of the plurality of Zener diodes including an anode end coupled to the external ground pin and a cathode end coupled to a corresponding Serial Peripheral Interface (SPI) pin of the E-fuse, each of the plurality of Zener diodes configured to block a reverse current flowing from the microcontroller to the corresponding SPI pin of the E-fuse when the battery is installed with the reverse polarity.

In accordance with an embodiment, the circuit further includes wherein the at least one external MOSFET includes a plurality of external MOSFETs connected in parallel, a number of the plurality of external MOSFETs determined in accordance with a load coupled to the plurality of external MOSFETs.

In accordance with an embodiment, a method for reverse battery protection includes having at least one external MOSFET coupled between a battery voltage pin and a load, the load coupled between the at least one external MOSFET and an external ground pin. The method further includes in response to a battery being installed with reverse polarity, turning on a BJT disposed in a current path between the external ground pin and a gate of a first P-channel MOSFET to switch off the first P-channel MOSFET, the first P-channel MOSFET coupled between a gate output of an E-fuse and the at least one external MOSFET. The method further includes in response to the battery being installed with the reverse polarity, turning on a diode coupled between the external ground pin and the gate of the at least one external MOSFET to turn on the at least one external MOSFET.

In accordance with an embodiment, the method further includes in response to the battery being installed with correct polarity, turning off the BJT to switch on the first P-channel MOSFET, in response to the battery being installed with the correct polarity, turning off the diode, and in response to the battery being installed with the correct polarity, controlling the at least one external MOSFET via the gate output of the E-fuse.

In accordance with an embodiment, the method further includes having a N-channel MOSFET coupled between a ground pin of the E-fuse and the external ground pin, a gate of the N-channel MOSFET coupled to the battery voltage pin. The method further includes in response to the battery being installed with the reverse polarity, turning off the N-channel MOSFET to block a reverse current flowing from the external ground pin to the ground pin of the E-fuse.

In accordance with an embodiment, the method further includes in response to the battery being installed with the correct polarity, turning on the N-channel MOSFET to couple the ground pin of the E-fuse to the external ground pin.

In accordance with an embodiment, the method further includes having a second P-channel MOSFET coupled between a microcontroller and a VSPI pin of the E-fuse and in response to the battery being installed with the reverse polarity, turning off the second P-channel MOSFET to block a reverse current flowing from the microcontroller to the VSPI pin of the E-fuse.

In accordance with an embodiment, the method further includes in response to the battery being installed with the correct polarity, turning on the second P-channel MOSFET to couple the microcontroller to the VSPI pin of the E-fuse.

In accordance with an embodiment, the method further includes having a Zener diode, an anode of the Zener diode coupled to the ground pin of the E-fuse, a cathode of the Zener diode coupled to a SPI pin of the E-fuse and a microcontroller, and in response to the battery being installed with the reverse polarity, blocking a reverse current flowing from the microcontroller to the SPI pin of the E-fuse.

In accordance with an embodiment, the method further includes wherein the at least one external MOSFET includes a plurality of external MOSFETs connected in parallel, a number of the plurality of external MOSFETs determined in accordance with the load.

In accordance with an embodiment, the method further includes wherein the battery voltage pin is coupled to a positive terminal of the battery when the battery is installed with the correct polarity and is coupled to a negative terminal of the battery when the battery is installed with the reverse polarity.

In accordance with an embodiment, a battery management device includes a microcontroller, an E-fuse, and a protection circuit coupled to the microcontroller and the E-fuse. The protection circuit includes an isolation circuit including a P-channel MOSFET and a BJT, the isolation circuit coupled between the E-fuse and at least one external MOSFET, the isolation circuit configured to disconnect the E-fuse from the at least one external MOSFET when the battery is installed with reverse polarity. The protection circuit further includes a control circuit including a diode coupled to the at least one external MOSFET, the control circuit configured to turn on the at least one external MOSFET when the battery is installed with the reverse polarity. The protection circuit further includes a reverse current protection circuit including at least one MOSFET or at least one Zener diode coupled to the E-fuse, the reverse current protection circuit configured to block one or more reverse currents flowing from an external ground pin or the microcontroller into the E-fuse when the battery is installed with the reverse polarity.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

A conventional system protected by an E-fuse will be described in FIG. 1, followed by embodiment systems with reverse battery protection and corresponding circuits will be described using FIGS. 2, 3, and 5.

Figure 1:
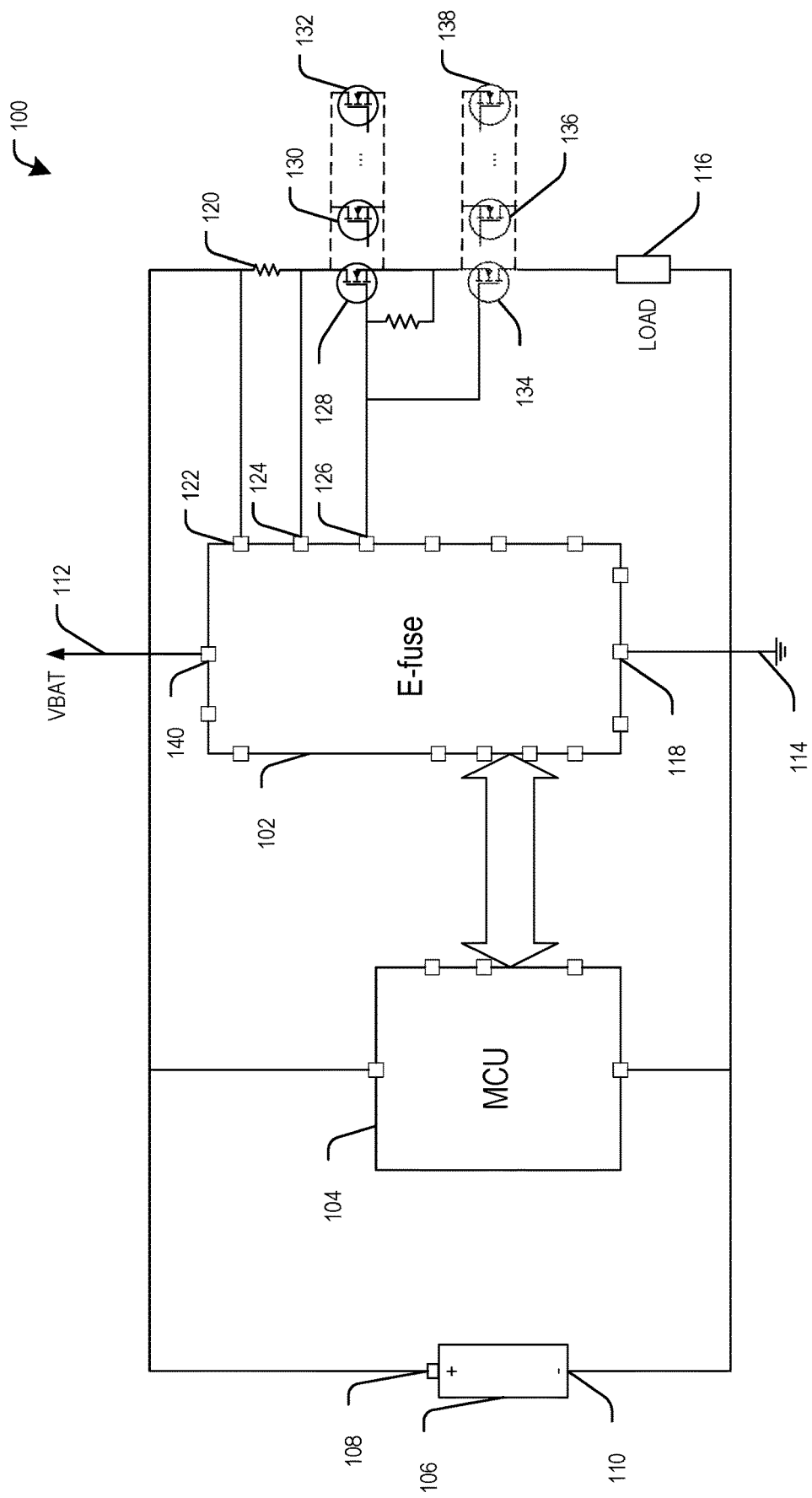
FIG. 1 illustrates a battery powered system protected by an electronic fuse (E-fuse)

FIG. 1 illustrates a battery powered system protected by an E-fuse. A battery powered system wo may include a battery 106, a microcontroller 104, an E-fuse 102, and an external load 116. The battery 106 may provide power to other devices. The microcontroller 104 may be an ECU of an automobile and may control several other parts of the automobile (like a sensor or an engine). The E-fuse 102 may provide circuit protection functions to the battery powered system wo by detecting and reacting to abnormal conditions in the system.

As shown in FIG. 1, the E-fuse 102 may be coupled to the microcontroller 104. The E-fuse 102 and the microcontroller 104 may be coupled through Serial Peripheral Interface (SPI), which is a communication interface that allows the microcontroller 104 to communicate with external devices. For example, the SPI may be implemented based on the "ST-SPI Specification." The E-fuse 102 may operate in Slave mode on a bus configuration through signal lines including a chip select/enable (CSN) pin, a serial data in (SDI) pin, a serial data out (SDO) pin, and a serial clock (SCK) pin, with 32 bits SPI frames.

In an example, the E-fuse 102 may provide overcurrent protection. The E-fuse 102 may take measurements (e.g., voltage measurements) using two pins 122 and 124 that are connected to two ends of a resistor 120. The E-fuse 102 may estimate a current passing through the external load 116 and the resistor 120. If the E-fuse 102 determines that the current exceeds a threshold, it may output a signal via a gate output pin 126 to turn off a switch. The switch may be implemented by a metal-oxide-semiconductor field-effect transistor (MOSFET) 128, as shown in FIG. 1. Thus, in this overcurrent situation, the E-fuse 102 may open the circuit and block the overcurrent to avoid possible damage to devices in the battery powered system 100.

Reverse battery is another abnormal condition that may cause severe damage to an electrical device. Installation mistakes can be made when a battery is installed or reinstalled. For instance, a car battery may be reinstalled or replaced during maintenance of the car. It is possible that the battery is installed incorrectly so that the polarity of the battery is in reverse direction. FIG. 1 depicts a correct installation of the battery 106. A positive terminal 108 of the battery 106 is coupled to a $V_{BAT}$ pin 112. A negative terminal 110 of the battery 106 is coupled to an external ground pin 114. In an event of reverse battery (not shown in FIG. 1), the battery 106 may be installed backward (i.e., installed with reverse polarity) so that the positive terminal 108 may be coupled to the external ground pin 114, and the negative terminal no may be coupled to the $V_{BAT}$ pin 112. The microcontroller 104 and the E-fuse 102 may be destroyed by an unexpected and unlimited current caused by a reversed battery. To keep devices (such as the microcontroller 104 and the E-fuse 102 in FIG. 1) that are powered by a battery safe, reverse battery protection may be a mandatory requirement, especially for automotive applications.

Driving two back-to-back MOSFETs is a traditional solution for reverse battery protection. This solution may include the MOSFET 128 and another MOSFET 134 connected in series as shown in FIG. 1. Furthermore, these two MOSFETs are connected back-to-back so that their gates are coupled together and their body diodes are placed in opposite directions. This way, when the polarity of the battery 106 is reversed, the E-fuse 102 may not be properly powered and thus may not output voltage (through the gate output pin 126) to turn on the MOSFETs 128 and 134. Therefore, a reverse current possibly caused by a reverse battery (flowing from the external ground pin 114 into the external load 116) will be blocked. If a load current is high, the current may exceed a capacity of one pair of back-to-back MOSFETs. Multiple back-to-back MOSFET pairs connected in parallel may be needed in such cases. FIG. 1 illustrates a second pair including a MOSFET 130 and a MOSFET 136 and a third pair including a MOSFET 132 and a MOSFET 138. A number of the multiple back-to-back MOSFET pairs may be determined by the characteristics of a single MOSFET, the battery 106, and the external load 116.

The traditional back-to-back MOSFET reverse battery protection may have many drawbacks. The number of the MOSFETs are being doubled which enlarges the printed circuit board (PCB) size and increases the manufacturing cost. A large number of MOSFETs may produce high power dissipation via their body diodes in case of reverse battery. The power dissipation may drain the battery and even damage the MOSFETs. In addition, this solution may result in a slower switching speed of the MOSFETs. Therefore, more advanced methods and apparatuses for reverse battery protection based on E-fuse products are desired.

Specifically, some types of loads, e.g., resistive loads are amenable to current flow during reverse battery situations, i.e., they are not damaged by the flow of reverse current. In such cases, an expensive back-to-back MOSFET solution may not be necessary. However, the inventors of this application identified that removing MOSFET 134 will allow a current flow through the MOSFET 128, i.e., diode current, during reverse battery causing significant heating and power dissipation. Embodiments of the present disclosure describe, among other things, techniques to reduce power dissipation.

Aspects of the present disclosure provide embodiment techniques that replace part of the multiple MOSFETs used in the traditional solution with a reverse battery protection circuit that is less expensive than the traditional back-to-back MOSFET topology. The reverse battery protection circuit is designed to generate a voltage on a gate of the external MOSFETs to turn them on in case of reverse battery. Thus, the proposed techniques may reduce the power dissipation of the external MOSFETs. Furthermore, the quantity of MOSFETs required for reverse battery protection is reduced. The above aspects and other inventive aspects are discussed in greater detail below.

Figure 2:
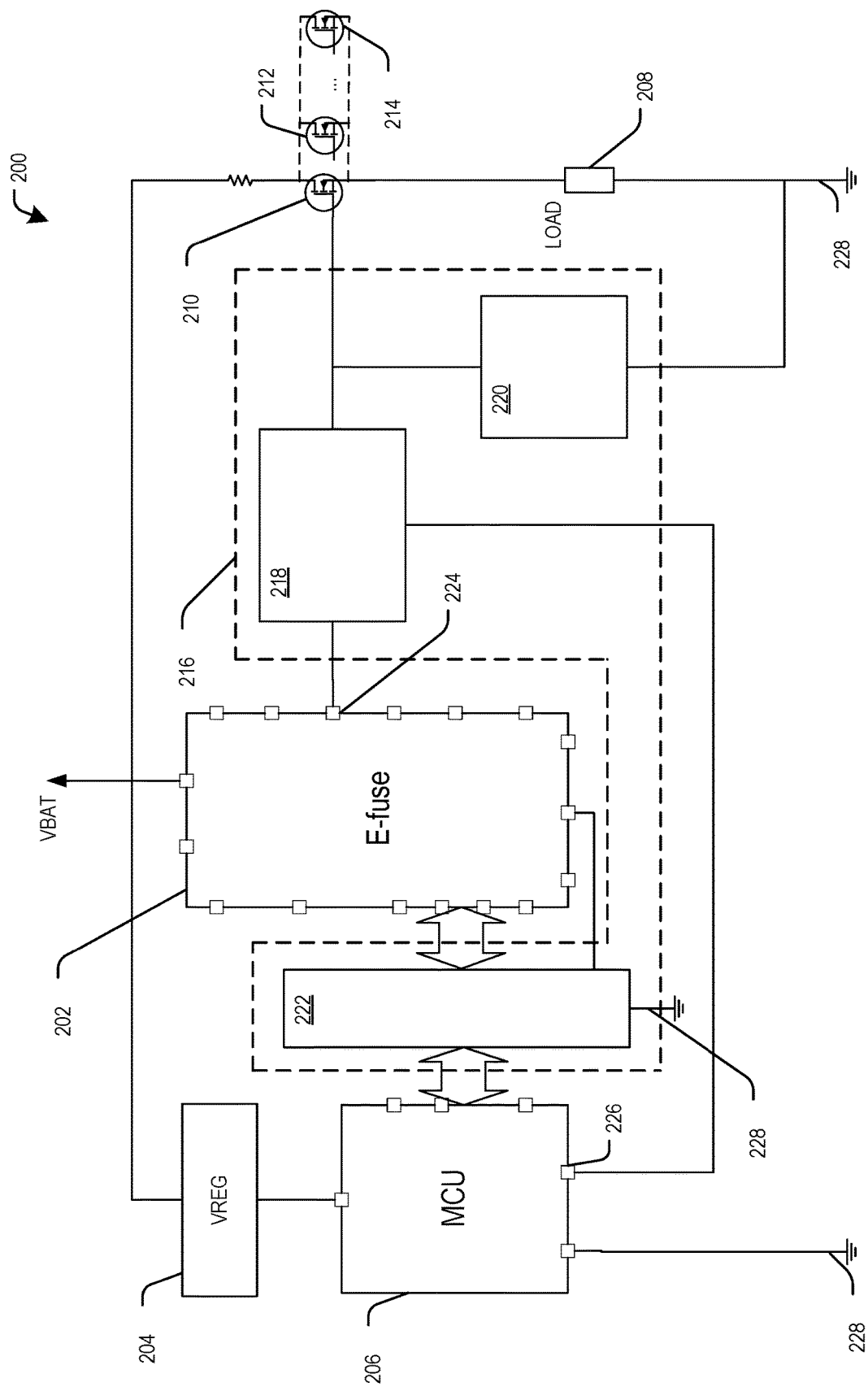
FIG. 2 illustrates an embodiment reverse battery protection circuit.
Figure 3:
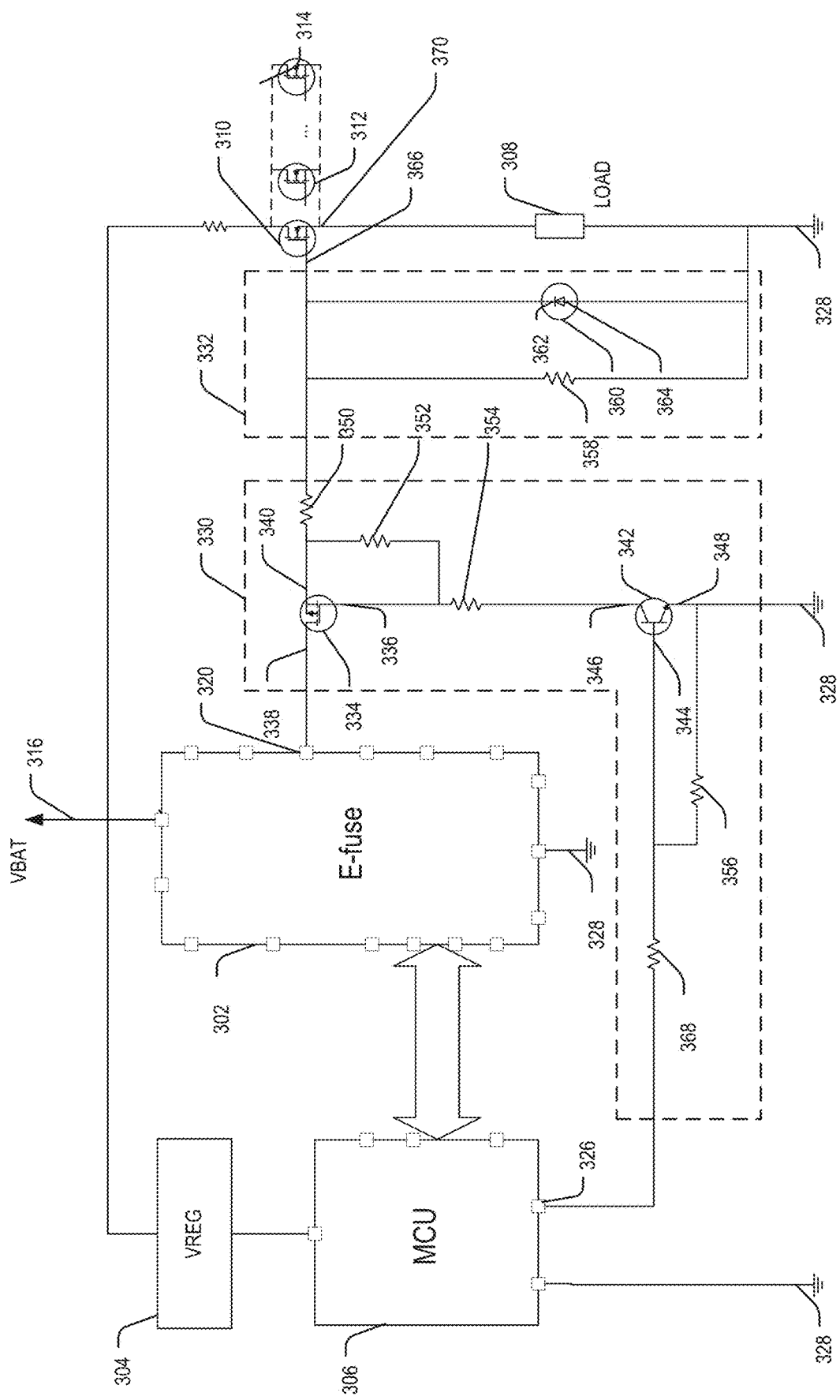
FIG. 3 depicts an embodiment implementation of an isolation circuit and a control circuit.

FIG. 2 illustrates an embodiment reverse battery protection circuit. As shown in FIG. 2, a battery powered system 200 may only use one or more external MOSFETs 210, 212, and 214 connected in parallel, instead of a back-to-back configuration (like the way MOSFETs 128-138 are connected in FIG. 1). As discussed above, a number of the one or more external MOSFETs 210, 212, and 214 required may be determined based on a load current, which may depend on a capacity of a single MOSFET, a battery (not shown in FIG. 2), and an external load 208. The battery powered system 200 may include a reverse battery protection circuit 216 coupled to an E-fuse 202, a microcontroller 206, and the one or more external MOSFETs 210-214. The reverse battery protection circuit 216 may include an isolation circuit 218, a control circuit 220, and a reverse current protection circuit 222 as shown in FIG. 2.

In different figures of the present disclosure, E-fuses may be denoted by different reference numbers. For instance, FIG. 2 depicts the E-fuse 202, FIG. 3 depicts the E-fuse 302, and FIG. 5 depicts the E-fuse 502. The E-fuses denoted by difference reference numbers may refer to the same E-fuse. Similarly, voltage regulators and microcontrollers may also be denoted by different reference numbers in different figures. For instance, FIG. 2 depicts the microcontroller 206, FIG. 3 depicts the microcontroller 306, and FIG. 5 depicts the microcontroller 506. The microcontrollers denoted by difference reference numbers may refer to the same microcontroller.

The isolation circuit 218 may be coupled to the E-fuse 202 through pin 224, the one or more external MOSFETs 210-214, and the microcontroller 206 through pin 224. The isolation circuit 218 may be configured to disconnect the E-fuse 202 from the one or more external MOSFETs 210-214 when the battery is installed backward.

The E-fuse 202 may be a single chip containing circuitry to behave like a programmable or smart fuse. Generally, E-fuses are integrated circuits that can replace larger conventional fuses or other protection devices such as resettable polymeric fuses. Housed in small plastic packages, such as DFN and Flip-chip, they integrate a control circuit and a power switch with low on-resistance, connecting the input port to the load.

When connected in series to the main battery, the E-Fuse 202 operates like a standard fuse with the ability of detecting and quickly reacting to overcurrent and overvoltage conditions. When an overload condition occurs, the E-fuse 202 may limit the output current to a safe value defined by the user. If the anomalous overload condition persists, the E-fuse 202 may go into an open state, disconnecting the load from the power supply. The overload current limit can be programmed by an external resistor.

The microcontroller 206 may be a general microcontroller or an automotive microcontroller. The microcontroller 206 may be located in a battery management system (BMS) and may manage a rechargeable battery (cell or battery pack) with the aim of improving its overall performance in terms of energy storage and battery life. The microcontroller 206 may help protect the battery from operating outside the specifications, balance it, monitor the health of the cells and communicate the battery status to higher-level systems. The microcontroller 206 may communicate with measurement circuits via SPI interfaces and communicate with other system level controller via Controller Area Network Flexible Data-Rate CAN-FD interfaces.

The control circuit 220 may be coupled to the one or more external MOSFETs 210-214 and an external ground pin 228. The control circuit 220 may be configured to turn on the one or more external MOSFETs 210-214 when the battery is installed backward.

The reverse current protection circuit 222 may be coupled to the microcontroller 206, the E-fuse 202, and the external ground pin 228. The reverse current protection circuit 222 may be configured to block one or more reverse currents flowing from the external ground pin 228 or the microcontroller 206 into the E-fuse 202 when the battery is installed backward.

Not all the isolation circuit 218, the control circuit 220, and the reverse current protection circuit 222 may be required in the reverse battery protection circuit 216. In various embodiments, a reverse battery protection circuit may include at least one of the isolation circuit, the control circuit, and the reverse current protection circuit.

The voltage regulator VREG 204, 304 is configured to regulate the voltage supplied by the battery. For example, VREG 204, 304 may comprise a linear regular so as to maintain the supply voltage to the MCU 206, 306 at a constant voltage despite a varying supply from the battery.

In one embodiment, a proposed reverse battery protection circuit may include an isolation circuit and a control circuit. FIG. 3 depicts an embodiment implementation of an isolation circuit and a control circuit. As shown in FIG. 3, an isolation circuit 33o may include a P-channel MOSFET 334. A source 340 of the P-channel MOSFET 334 is coupled to a gate 366 of an external MOSFET 310. Extra MOSFETs 312 and 314 may be connected with the external MOSFET 310 in parallel depending on a load current and a capacity of the external MOSFET 310. A drain 338 of the P-channel MOSFET 334 is coupled to a gate output 320 of an E-fuse 302.

The isolation circuit 330 may further include a bipolar junction transistor (BJT) 342, for example, a NPN transistor. In certain embodiments, a N-channel MOSFET may be used instead of the NPN transistor although the BJT may provide a better control of the gate voltage of the P-channel MOSFET 310. A collector 346 of the BJT 342 is coupled to the gate 366 of the external P-channel MOSFET 310. An emitter 348 of the BJT 342 is coupled to an external ground pin 328. A base 344 of the BJT 342 is coupled to an I/O pin 326 of a microcontroller 306.

There may be a resistor 368 between the I/O pin 326 of the microcontroller 306 and the base 344 of the BJT 342. In an embodiment, the resistor 368's resistance may be several kΩs, e.g., 10 kΩ to 30 kΩ. The base 344 of the BJT 342 may be coupled to the emitter 348 of the BJT 342 via a resistor 356. In an embodiment, the resistor 356's resistance may be several kΩs, e.g., 10 kΩ to 30 kΩ, so that the emitter 348 is coupled to the I/O pin 326 through effectively a higher resistance path. The collector 346 of the BJT 342 may be coupled to the gate 366 of the external P-channel MOSFET 310 via a resistor 354. In an embodiment, the resistor 354's resistance is less than the resistor 356's resistance, e.g., between 0.5 kΩ to 5 kΩ. The source 340 of the P-channel MOSFET 334 may be coupled to the gate 336 of the P-channel MOSFET 334 via a resistor 352. In one embodiment, the resistor 352's resistance may be much higher than resistor 354 and may be several kΩs, e.g., 40 kΩ to 60 kΩ. The source 340 of the P-channel MOSFET 334 may be coupled to the gate 366 of an external MOSFET 310 via an optional resistor 350 that is a low resistance path. In one embodiment, the resistor 350's resistance is a few Ωs, e.g., 5Ω to 20Ω.

When the battery is installed correctly (i.e., installed with correct polarity), a $V_{BAT}$ pin 316 is coupled to a positive terminal of the battery and the external ground pin 328 is coupled to a negative terminal of the battery. The microcontroller 306 may be driven properly by the battery and may set a voltage of the I/O pin 326 at a high level. As a result, a current is injected into the base 344 of the BJT 342, which turns on the BJT 342. Thus, the gate 336 of the P-channel MOSFET 334 is pulled down to the external ground pin 328 and receives a low voltage. The low voltage at the gate 336 of the P-channel MOSFET 334 may turn on the P-channel MOSFET 334. As the P-channel MOSFET 334 turns on, the voltage generated at the gate output 320 of the E-fuse 302 may pull up the gate 366 of the external MOSFET 310 so as to turn on the external MOSFET 310. Consequently, the E-fuse 302 may control the external MOSFET 310 and provide circuit protection functions via the gate output 320.

When the battery is installed backward, the $V_{BAT}$ pin 316 is coupled to the negative terminal of the battery and the external ground pin 328 is coupled to the positive terminal of the battery. The microcontroller 306 may not provide a current path from the I/O pin 326 because the microcontroller 306 is not powered up. Thus, the BJT 342 may be switched off, which means that the voltage at the gate 336 of the P-channel MOSFET 334 may not be pulled down. As a result, the P-channel MOSFET 334 may be turned off, which isolates the gate output 320 of the E-fuse 302 from the gate 366 of the external MOSFET 310. As will be clear, the potential applied at the gate 366 of the external MOSFET 310 during reverse installation should not be observed at the gate output 320 of the E-fuse 302 to prevent damage to the E-fuse 302. Embodiments enable this as the P-channel MOSFET 334 is not only turned off, but it is also reverse biased and therefore there is no possibility of having a flow of diode current through the P-channel MOSFET 334.

In one embodiment, a control circuit 332 may include a diode 360. As shown in FIG. 3, an anode 364 of the diode 360 is coupled to the external ground pin 328 and a cathode 362 of the diode 360 is coupled to the gate 366 of the external MOSFET 310. In various embodiments, the control circuit 332 may include a resistor 358 connected to the diode 360 in parallel. For example, the resistor 358's resistance may be a high resistance path, e.g., about 5 kΩ to 20 kΩ. In certain embodiments, the resistor 358 may be removed.

When the battery is installed correctly, the voltage at the gate 366 of the external MOSFET 310 may be controlled by the E-fuse 302 through the gate output 320. The diode 360 is in reverse bias and does not contribute to the operation of the circuit.

When the battery is installed backward, the external ground pin 328 is coupled to the positive terminal of the battery. Thus, the voltage at the gate 366 of the external MOSFET 310 may be a voltage at the positive terminal of the battery minus a forward voltage (which usually is small) of the diode 360. The voltage at a source 370 of the external MOSFET 310 may be a forward voltage of the external MOSFET 310. As a result, a voltage difference $V_{GS}$ between the voltage at the gate 366 and the voltage at the source 370 of the external MOSFET 310 may still be high (positive) and thus turn on the external MOSFET 310. For example, the battery has a voltage of 12 volt (V), the forward voltage of the diode 360 is 0.7 V, and the forward voltage of the external MOSFET 310 also is 0.7 V. In this example, $V_{GS}$ will be 12 V−0.7 V−0.7 V=10.6 V if the battery is reversely connected. The threshold voltage of the external MOSFET 310 may be selected to be lower than 10.6 V, for example, 1 V. As a result, $V_{GS}$ (which is larger than 1 V) turns on the external MOSFET 310.

Compared with a situation without the isolation circuit 33o and the control circuit 332, since in the described embodiment the current is passing through the channel of the MOSFET instead of the body diode, the power dissipation of the external MOSFET 310 is reduced from $I \times V_F$ to $I^2 \times R_{DS(on)}$, where I is the value of the current passing through the external MOSFET 310, $V_F$ is the forward voltage of the external MOSFET 310, and $R_{DS(on)}$ is the resistance of the external MOSFET 310 when it is turned on. Of course, the ON resistance of the external MOSFET 310 is much lower.

Figure 4:
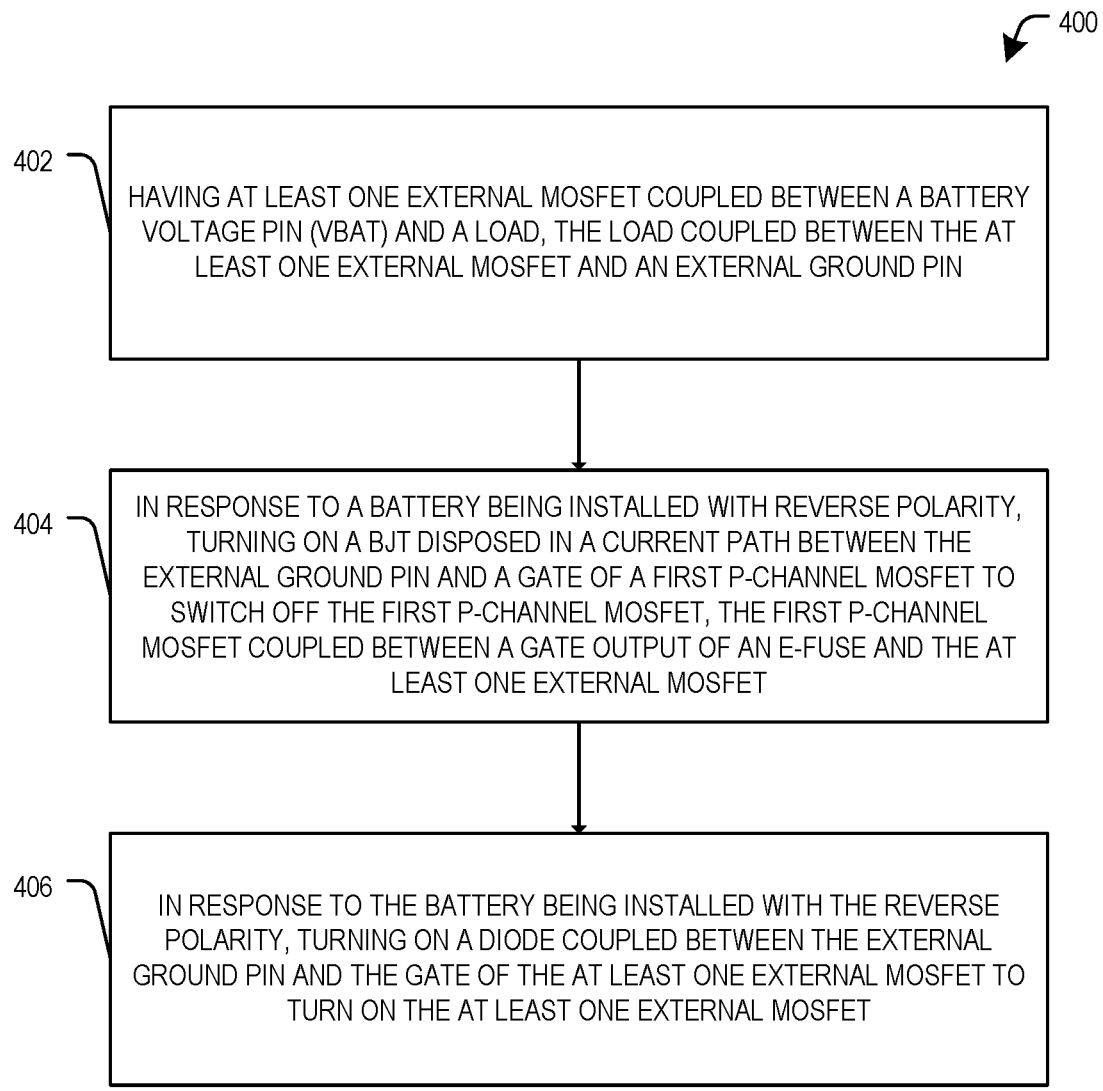
FIG. 4 illustrates an embodiment method performed by a proposed reverse battery protection circuit when a battery is installed with reverse polarity.

FIG. 4 illustrates an embodiment method performed by a proposed reverse battery protection circuit when a battery is installed backward. A method 400 may be performed by the reverse battery protection circuit illustrated in FIG. 2 and FIG. 3. The method 400 begins at step 402, where a reverse battery protection circuit has at least one external MOSFET coupled between a battery voltage pin and a load. The load is coupled between the at least one external MOSFET and an external ground pin.

The method 400 proceeds to step 404, where in response to a battery being installed with reverse polarity, the reverse battery protection circuit turns on a BJT disposed in a current path between the external ground pin and a gate of a first P-channel MOSFET to switch off the first P-channel MOSFET. The first P-channel MOSFET is coupled between a gate output of an E-fuse and the at least one external MOSFET.

The method 400 proceeds to step 406, where in response to the battery being installed with the reverse polarity, the reverse battery protection circuit turns on a diode to turn on the at least one external MOSFET. The diode is coupled between the external ground pin and the gate of the at least one external MOSFET.

In one embodiment, a proposed reverse battery protection circuit may include a reverse current protection circuit. FIG. 5 depicts an embodiment implementation of a reverse current protection circuit. A battery powered system 500 includes an E-fuse 502, a microcontroller 506, and a reverse current protection circuit 560. The reverse current protection circuit 560 may be designed to prevent one or more reverse currents flowing into the E-fuse 502 when a battery is installed backward.

The E-fuse 502 may have a GND_DEV pin 522. The GND_DEV pin 522 may be coupled to an external ground pin 528 when the battery is installed correctly. However, in an event of reverse battery, the external ground pin 528 is coupled to the positive terminal of the battery and thus may be pulled up to a high level voltage. In this case, a reverse current may flow from the external ground pin 528 to the E-fuse 502 via the GND_DEV pin 522. To prevent this reverse current from damaging the E-fuse 502, the reverse current protection circuit 560 may include a N-channel MOSFET 538. A gate 540 of the N-channel MOSFET 538 is coupled to a $V_{BAT}$ pin 516. A drain 542 of the N-channel MOSFET 538 is coupled to the GND_DEV pin 522 of the E-fuse 502. A source 544 of the N-channel MOSFET 538 is coupled to the external ground pin 528.

When the battery is installed correctly, the $V_{BAT}$ pin 516 is coupled to a positive terminal of the battery and the external ground pin 528 is coupled to a negative terminal of the battery. A voltage at the gate 540 of the N-channel MOSFET 538 is higher than a voltage at the source 544 of the N-channel MOSFET 538. When the voltage difference is larger than the threshold voltage of the N-channel MOSFET 538, the N-channel MOSFET 538 is turned on, which allows a current passing between the GND_DEV pin 522 and the external ground pin 528.

When the battery is installed backward, the $V_{BAT}$ pin 516 is coupled to the negative terminal of the battery and the external ground pin 528 is coupled to the positive terminal of the battery. The voltage at the gate 540 of the N-channel MOSFET 538 is lower than a voltage at the source 544 of the N-channel MOSFET 538. Thus, the N-channel MOSFET 538 is turned off, which isolates the GND_DEV pin 522 from the external ground pin 528 and blocks a possible reverse current flowing into the GND_DEV pin 522 from the external ground pin 528.

In various embodiments, the E-fuse 502 may communicate with the microcontroller via logic I/O pins. For example, an E-fuse product VNF1048F made by STMicroelectronics has multiple digital input pins such as a VSPI pin 508, an SDI pin 510, an SDO pin 512, a CSN pin 514, and a DIAG pin 518, etc. These digital input pins may be coupled to the microcontroller and thus may receive reverse currents from the microcontroller if the battery is installed backward.

To prevent a reverse current flowing into the E-fuse 502 via the VSPI pin 508, the reverse current protection circuit 560 may include a P-channel MOSFET 524. A gate 526 of the P-channel MOSFET 524 is coupled to the external ground pin 528. A source 530 of the P-channel MOSFET 524 is coupled to the microcontroller 506. A drain 532 of the P-channel MOSFET 524 is coupled to the VSPI pin 508 of the E-fuse 502. When the battery is installed correctly, a voltage at the gate 526 of the P-channel MOSFET 524 is at a low level. Thus, the P-channel MOSFET 524 is turned on, which allows input signal passing through the VSPI pin 508. When the battery is installed backward, the voltage at the gate 526 of the P-channel MOSFET 524 is at a high level. Thus, the P-channel MOSFET 524 is turned off, which isolates the VSPI pin 508 of the E-fuse 502 from the microcontroller 506.

Furthermore, the reverse current protection circuit 56o may use Zener diodes to prevent reverse currents flowing into the E-fuse 502 via SPI pins such as the SDI pin 510, the SDO pin 512, the CSN pin 514, and the DIAG pin 518, etc. In one embodiment, an anode of a Zener diode 534 is coupled to the GND_DEV pin 522 of the E-fuse 502. A cathode of the Zener diode 534 is coupled to a SPI pin of the E-fuse 502. In an event of reverse battery, the microcontroller 506 may output high voltages to the SPI pins. However, due to the Zener breakdown effect, each SPI pin may still receive a low voltage regulated by the Zener diode 534.

Figure 5:
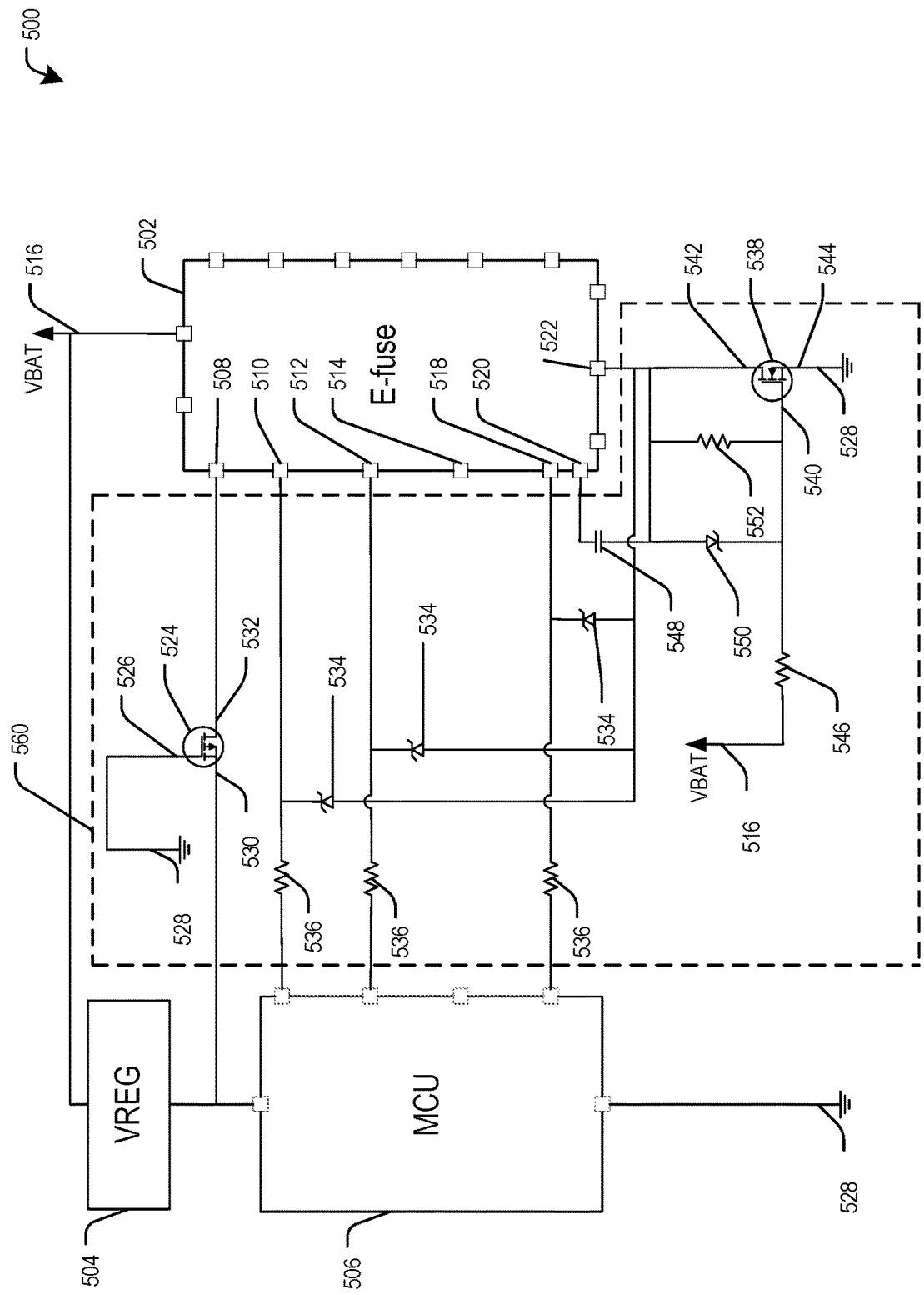
FIG. 5 depicts an embodiment implementation of a reverse current protection circuit.

Not all the N-channel MOSFET 538, the P-channel MOSFET 524, and the Zener diodes 534 in FIG. 5 have to be included in the reverse current protection circuit 560. In various embodiments, a reverse current protection circuit may include at least one of a N-channel MOSFET, a P-channel MOSFET, and a Zener diode.

Example embodiments of the invention are summarized here. Other embodiments can also be understood from the entirety of the specification as well as the claims filed herein.

Example 1. A circuit for reverse battery protection, the circuit including: an isolation circuit coupled between a gate output of an E-fuse and at least one external MOSFET, the E-fuse coupled between a battery voltage pin and an external ground pin and further coupled to to a microcontroller, the isolation circuit configured to disconnect the gate output from the at least one external MOSFET when a battery is installed with reverse polarity; and a control circuit coupled between the external ground pin and the at least one external MOSFET, the control circuit configured to turn on the at least one external MOSFET when the battery is installed with the reverse polarity.

Example 2. The circuit of Example 1, wherein the isolation circuit includes: a first P-channel MOSFET coupled between a gate of the at least one external MOSFET and the gate output of the E-fuse; and a BJT coupled between a gate of the first P-channel MOSFET and the external ground pin, the microcontroller coupled to the BJT and configured to turn on the BJT when the battery is installed with correct polarity and to turn off the BJT when the battery is installed with the reverse polarity.

Example 3. The circuits of Example 1 and Example 2, wherein the control circuit includes a diode coupled between the external ground pin and the gate of the at least one external MOSFET.

Example 4. The circuits of Example 1 through Example 3, further including a N-channel MOSFET, a gate of the N-channel MOSFET coupled to the battery voltage pin, a drain of the N-channel MOSFET coupled to a ground pin of the E-fuse, a source of the N-channel MOSFET coupled to the external ground pin, the N-channel MOSFET configured to block a reverse current flowing from the external ground pin to the ground pin of the E-fuse when the battery is installed with the reverse polarity.

Example 5. The circuits of Example 1 through Example 4, further including a second P-channel MOSFET, a gate of the second P-channel MOSFET coupled to the external ground pin, a source of the second P-channel MOSFET coupled to the microcontroller, a drain of the second P-channel MOSFET coupled to a VSPI pin of the E-fuse, the second P-channel MOSFET configured to block a reverse current flowing from the microcontroller to the VSPI pin of the E-fuse when the battery is installed with the reverse polarity.

Example 6. The circuits of Example 1 through Example 5, further including a plurality of Zener diodes, each of the plurality of Zener diodes including an anode end coupled to the external ground pin and a cathode end coupled to a corresponding SPI pin of the E-fuse, each of the plurality of Zener diodes configured to block a reverse current flowing from the microcontroller to the corresponding SPI pin of the E-fuse when the battery is installed with the reverse polarity.

Example 7. The circuits of Example 1 through Example 6, wherein the at least one external MOSFET includes a plurality of external MOSFETs connected in parallel, a number of the plurality of external MOSFETs determined in accordance with a load coupled to the plurality of external MOSFETs.

Example 8. A method for reverse battery protection, the method including: having at least one external MOSFET coupled between a battery voltage pin and a load, the load coupled between the at least one external MOSFET and an external ground pin; in response to a battery being installed with reverse polarity, turning on a BJT disposed in a current path between the external ground pin and a gate of a first P-channel MOSFET to switch off the first P-channel MOSFET, the first P-channel MOSFET coupled between a gate output of an E-fuse and the at least one external MOSFET; and in response to the battery being installed with the reverse polarity, turning on a diode coupled between the external ground pin and the gate of the at least one external MOSFET to turn on the at least one external MOSFET.

Example 9. The method of Example 8, further including: in response to the battery being installed with correct polarity, turning off the BJT to switch on the first P-channel MOSFET; in response to the battery being installed with the correct polarity, turning off the diode; and in response to the battery being installed with the correct polarity, controlling the at least one external MOSFET via the gate output of the E-fuse.

Example 10. The methods of Example 8 and Example 9, further including: having a N-channel MOSFET coupled between a ground pin of the E-fuse and the external ground pin, a gate of the N-channel MOSFET coupled to the battery voltage pin; and in response to the battery being installed with the reverse polarity, turning off the N-channel MOSFET to block a reverse current flowing from the external ground pin to the ground pin of the E-fuse.

Example 11. The methods of Example 8 through Example 10, further including: in response to the battery being installed with the correct polarity, turning on the N-channel MOSFET to couple the ground pin of the E-fuse to the external ground pin.

Example 12. The methods of Example 8 through Example 11, further including: having a second P-channel MOSFET coupled between a microcontroller and a VSPI pin of the E-fuse; and in response to the battery being installed with the reverse polarity, turning off the second P-channel MOSFET to block a reverse current flowing from the microcontroller to the VSPI pin of the E-fuse.

Example 13. The methods of Example 8 through Example 12, further including: in response to the battery being installed with the correct polarity, turning on the second P-channel MOSFET to couple the microcontroller to the VSPI pin of the E-fuse.

Example 14. The methods of Example 8 through Example 13, further including: having a Zener diode, an anode of the Zener diode coupled to the ground pin of the E-fuse, a cathode of the Zener diode coupled to a SPI pin of the E-fuse and a microcontroller; and in response to the battery being installed with the reverse polarity, blocking a reverse current flowing from the microcontroller to the SPI pin of the E-fuse.

Example 15. The methods of Example 8 through Example 14, wherein the at least one external MOSFET includes a plurality of external MOSFETs connected in parallel, a number of the plurality of external MOSFETs determined in accordance with the load.

Example 16. The methods of Example 8 through Example 15, wherein the battery voltage pin is coupled to a positive terminal of the battery when the battery is installed with the correct polarity and is coupled to a negative terminal of the battery when the battery is installed with the reverse polarity.

Example 17. A battery management device including: a microcontroller; an E-fuse; a protection circuit coupled to the microcontroller and the E-fuse, the protection circuit including an isolation circuit including a P-channel MOSFET and a BJT, the isolation circuit coupled between the E-fuse and at least one external MOSFET, the isolation circuit configured to disconnect the E-fuse from the at least one external MOSFET when the battery is installed with reverse polarity; a control circuit including a diode coupled to the at least one external MOSFET, the control circuit configured to turn on the at least one external MOSFET when the battery is installed with the reverse polarity; and a reverse current protection circuit including at least one MOSFET or at least one Zener diode coupled to the E-fuse, the reverse current protection circuit configured to block one or more reverse currents flowing from an external ground pin or the microcontroller into the E-fuse when the battery is installed with the reverse polarity.

Example 18. The battery management device of Example 17, wherein the P-channel MOSFET is coupled between a gate of the at least one external MOSFET and a gate output of the E-fuse, wherein the BJT is coupled between a gate of the P-channel MOSFET and the external ground pin, and wherein the microcontroller is coupled to the BJT and is configured to turn on the BJT when the battery is installed with correct polarity and to turn off the BJT when the battery is installed with the reverse polarity.

Example 19. The battery management devices of Example 17 and Example 18, wherein the at least one MOSFET includes a N-channel MOSFET, a gate of the N-channel MOSFET coupled to a battery voltage pin, a drain of the N-channel MOSFET coupled to a ground pin of the E-fuse, a source of the N-channel MOSFET coupled to the external ground pin, the N-channel MOSFET configured to block a reverse current flowing from the external ground pin to the ground pin of the E-fuse when the battery is installed with the reverse polarity.

Example 20. The battery management devices of Example 17 through Example 19, wherein the at least one Zener diode includes a plurality of Zener diodes, each of the plurality of Zener diodes including an anode end coupled to the external ground pin and a cathode end coupled to a corresponding SPI pin of the E-fuse, each of the plurality of Zener diodes configured to block a reverse current flowing from the microcontroller to the corresponding SPI pin of the E-fuse when the battery is installed with the reverse polarity.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit for reverse battery protection, the circuit comprising:
   an isolation circuit coupled between a gate output of an electronic fuse (E-fuse) and at least one metal-oxide-semiconductor field-effect transistor (MOSFET), the at least one MOSFET being external to the E-fuse and the isolation circuit and coupled to a battery voltage pin, the E-fuse coupled between the battery voltage pin and a ground pin and further coupled to a microcontroller, the microcontroller being coupled between the battery voltage pin and the ground pin, the isolation circuit configured to disconnect the gate output from the at least one MOSFET when a battery is installed with reverse polarity; and
   a reverse polarity circuit coupled between the ground pin and the at least one MOSFET, the reverse polarity circuit configured to turn on the at least one MOSFET when the battery is installed with the reverse polarity.

2. The circuit of claim 1, wherein the isolation circuit includes:
   a first P-channel MOSFET coupled between a gate of the at least one external MOSFET and the gate output of the E-fuse; and
   a bipolar junction transistor (BJT) coupled between a gate of the first P-channel MOSFET and the ground pin, the microcontroller coupled to the BJT and configured to turn on the BJT when the battery is installed with correct polarity and to turn off the BJT when the battery is installed with the reverse polarity.

3. The circuit of claim 1, wherein the reverse polarity circuit includes a diode coupled between the ground pin and the gate of the at least one MOSFET.

4. The circuit of claim 1, further including a N-channel MOSFET, a gate of the N-channel MOSFET coupled to the battery voltage pin, a drain of the N-channel MOSFET coupled to a ground pin of the E-fuse, a source of the N-channel MOSFET coupled to the ground pin, the N-channel MOSFET configured to block a reverse current flowing from the ground pin to the ground pin of the E-fuse when the battery is installed with the reverse polarity.

5. The circuit of claim 1, further including a second P-channel MOSFET, a gate of the second P-channel MOSFET coupled to the ground pin, a source of the second P-channel MOSFET coupled to the microcontroller, a drain of the second P-channel MOSFET coupled to a Virtual Serial Peripheral Interface (VSPI) pin of the E-fuse, the second P-channel MOSFET configured to block a reverse current flowing from the microcontroller to the VSPI pin of the E-fuse when the battery is installed with the reverse polarity.

6. The circuit of claim 1, further including a plurality of Zener diodes, each of the plurality of Zener diodes including an anode end coupled to the ground pin and a cathode end coupled to a corresponding Serial Peripheral Interface (SPI) pin of the E-fuse, each of the plurality of Zener diodes configured to block a reverse current flowing from the microcontroller to the corresponding SPI pin of the E-fuse when the battery is installed with the reverse polarity.

7. The circuit of claim 1, wherein the at least one MOSFET includes a plurality of MOSFETs connected in parallel, a number of the plurality of MOSFETs determined in accordance with a load coupled to the plurality of MOSFETs.

8. A method for reverse battery protection, the method comprising:
   having a microcontroller coupled between a battery voltage pin and a ground pin and an electronic fuse (E-fuse) coupled between the battery voltage pin and the ground pin;
   having at least one metal-oxide-semiconductor field-effect transistor (MOSFET) coupled between the battery voltage pin and a load, the at least one MOSFET being external to the E-fuse, the load coupled between the at least one MOSFET and the ground pin;
   in response to a battery being installed with reverse polarity, turning on a bipolar junction transistor (BJT) disposed in a current path between the ground pin and a gate of a first P-channel MOSFET to switch off the first P-channel MOSFET, the first P-channel MOSFET coupled between a gate output of the E-fuse and the at least one MOSFET; and
   in response to the battery being installed with the reverse polarity, turning on a diode coupled between the ground pin and the gate of the at least one MOSFET to turn on the at least one MOSFET.

9. The method of claim 8, further comprising:
   in response to the battery being installed with correct polarity, turning off the BJT to switch on the first P-channel MOSFET;
   in response to the battery being installed with the correct polarity, turning off the diode; and
   in response to the battery being installed with the correct polarity, controlling the at least one MOSFET via the gate output of the E-fuse.

10. The method of claim 8, further comprising:
    having a N-channel MOSFET coupled between a ground pin of the E-fuse and the ground pin, a gate of the N-channel MOSFET coupled to the battery voltage pin; and in response to the battery being installed with the reverse polarity, turning off the N-channel MOSFET to block a reverse current flowing from the ground pin to the ground pin of the E-fuse.

11. The method of claim 10, further comprising:
in response to the battery being installed with the correct polarity, turning on the N-channel MOSFET to couple the ground pin of the E-fuse to the ground pin.

12. The method of claim 8, further comprising:
having a second P-channel MOSFET coupled between the microcontroller and a Virtual Serial Peripheral Interface (VSPI) pin of the E-fuse; and
in response to the battery being installed with the reverse polarity, turning off the second P-channel MOSFET to block a reverse current flowing from the microcontroller to the VSPI pin of the E-fuse.

13. The method of claim 12, further comprising:
in response to the battery being installed with the correct polarity, turning on the second P-channel MOSFET to couple the microcontroller to the VSPI pin of the E-fuse.

14. The method of claim 8, further comprising:
having a Zener diode, an anode of the Zener diode coupled to the ground pin of the E-fuse, a cathode of the Zener diode coupled to a Serial Peripheral Interface (SPI) pin of the E-fuse and the microcontroller; and
in response to the battery being installed with the reverse polarity, blocking a reverse current flowing from the microcontroller to the SPI pin of the E-fuse.

15. The method of claim 8, wherein the at least one MOSFET includes a plurality of MOSFETs connected in parallel, a number of the plurality of MOSFETs determined in accordance with the load.

16. The method of claim 8, wherein the battery voltage pin is coupled to a positive terminal of the battery when the battery is installed with the correct polarity and is coupled to a negative terminal of the battery when the battery is installed with the reverse polarity.

17. A battery management device comprising:
a microcontroller coupled between a battery voltage pin and a ground pin;
an electronic fuse (E-fuse) coupled between the battery voltage pin and the ground pin;
an isolation circuit including a P-channel MOSFET and a bipolar junction transistor (BJT), the isolation circuit coupled between the E-fuse and at least one metal-oxide-semiconductor field-effect transistor (MOSFET), the at least one MOSFET being external to the E-fuse and the isolation circuit and coupled to the battery voltage pin, the isolation circuit configured to disconnect the E-fuse from the at least one MOSFET when a battery is installed with reverse polarity;
a diode coupled to the at least one MOSFET, the diode configured to turn on the at least one MOSFET when the battery is installed with the reverse polarity; and
a reverse current protection circuit including at least one MOSFET or at least one Zener diode coupled to the E-fuse, the reverse current protection circuit configured to block one or more reverse currents flowing from the ground pin or the microcontroller into the E-fuse when the battery is installed with the reverse polarity.

18. The battery management device of claim 17, wherein the P-channel MOSFET is coupled between a gate of the at least one MOSFET and a gate output of the E-fuse, wherein the BJT is coupled between a gate of the P-channel MOSFET and the ground pin, and wherein the microcontroller is coupled to the BJT and is configured to turn on the BJT when the battery is installed with correct polarity and to turn off the BJT when the battery is installed with the reverse polarity.

19. The battery management device of claim 17, wherein the at least one MOSFET includes a N-channel MOSFET, a gate of the N-channel MOSFET coupled to the battery voltage pin, a drain of the N-channel MOSFET coupled to a ground pin of the E-fuse, a source of the N-channel MOSFET coupled to the ground pin, the N-channel MOSFET configured to block a reverse current flowing from the ground pin to the ground pin of the E-fuse when the battery is installed with the reverse polarity.

20. The battery management device of claim 17, wherein the at least one Zener diode includes a plurality of Zener diodes, each of the plurality of Zener diodes including an anode end coupled to the ground pin and a cathode end coupled to a corresponding Serial Peripheral Interface (SPI) pin of the E-fuse, each of the plurality of Zener diodes configured to block a reverse current flowing from the microcontroller to the corresponding SPI pin of the E-fuse when the battery is installed with the reverse polarity.

* * * * *